United States Patent
Vrzala

(10) Patent No.: US 11,777,490 B2
(45) Date of Patent: Oct. 3, 2023

(54) NORMALLY CLOSED SOLID STATE RELAY USING NORMALLY OPEN COMPONENTS

(71) Applicant: Axis AB, Lund (SE)

(72) Inventor: Ondřej Vrzala, Prague (CZ)

(73) Assignee: AXIS AB, Lund (SE)

( * ) Notice: Subject to any disclaimer, the term of this patent is extended or adjusted under 35 U.S.C. 154(b) by 0 days.

(21) Appl. No.: 17/886,657

(22) Filed: Aug. 12, 2022

(65) Prior Publication Data

US 2023/0077106 A1    Mar. 9, 2023

(30) Foreign Application Priority Data

Sep. 6, 2021 (EP) .................................. 21195000

(51) Int. Cl.
  *H03K 17/30* (2006.01)
  *H03K 17/06* (2006.01)

(52) U.S. Cl.
  CPC ......... *H03K 17/302* (2013.01); *H03K 17/063* (2013.01)

(58) Field of Classification Search
  CPC ............. G01R 31/389; G01R 31/3644; G01R 31/385; G01R 31/66; G01R 33/066; H01M 10/4285; H01M 10/482; H04Q 2213/02; H04Q 2213/1302
  See application file for complete search history.

(56) References Cited

U.S. PATENT DOCUMENTS

| | | |
|---|---|---|
| 8,842,402 B2 | 9/2014 | Signorelli et al. |
| 2010/0073082 A1 | 3/2010 | Takeshita et al. |
| 2010/0117095 A1 | 5/2010 | Zhang |
| 2017/0230048 A1 | 8/2017 | Nilles et al. |
| 2022/0286126 A1* | 9/2022 | Wakazono ............. H03K 17/74 |

FOREIGN PATENT DOCUMENTS

DK     201770767 A1    4/2018

OTHER PUBLICATIONS

Extended European Search Report dated Mar. 3, 2022 for European Patent Application No. 21195000.1.
Chao et al., "Re-designing normally-on load switches with zero-power MOSFETs reduces power consumption," Advanced Linear Devices, https://www.aldinc.com/pdf/ZeroPowerNormallyONSwitch.pdf, Available at: https://web.archive.org/web/20190130142221/https://www.aldinc.com/pdf/ZeroPowerNormallyONSwitch.pdf (Jan. 30, 2019).

* cited by examiner

*Primary Examiner* — Jung Kim
(74) *Attorney, Agent, or Firm* — Volpe Koenig

(57) ABSTRACT

A solid-state relay includes a semiconductor switch and a voltage boost block. The semiconductor switch has a control input, which causes the semiconductor switch to shift from an open, non-conducting position to a closed, conducting position when a voltage is applied to the control input. The voltage boost block includes a boost converter and a ground connector. A voltage output of the semiconductor switch is electrically connected to a voltage input of the boost converter. A voltage output of the boost converter is electrically connected to the control input. The ground connector of the boost converter is electrically connected to a voltage input of the semiconductor switch When the semiconductor switch is in the closed position, the semiconductor switch is maintained in a closed position in the absence of another control signal.

6 Claims, 3 Drawing Sheets

NORMALLY CLOSED SOLID STATE RELAY USING NORMALLY OPEN COMPONENTS

FIELD OF INVENTION

The present disclosure relates to semiconductors, and more specifically to solid state relays (SSR).

TECHNICAL BACKGROUND

An electromagnetic relay is a type of electrical switch controlled by an electromagnet. Contacts on an electromagnetic relay can have two default states: normally closed (NC) or normally open (NO). Without an electric current driving the coil of the electromagnetic relay into an energized state, the contacts on the electromagnetic relay stay in their default state. For an electromagnetic relay with NC contacts, the default state of the circuit is to be closed and to conduct electric current. Conversely, for an electromagnetic relay with NO contacts, the default state of the circuit is to be open and not conduct any electric current.

Some applications, in particular those requiring high resistance against vibrations and/or magnetic fields, cannot use electromagnetic relays and instead call for use of SSRs. An SSR switches on or off when an external voltage (AC or DC) is applied across its control terminals. It serves the same function as an electromagnetic relay, but has no moving parts (and therefore also has a longer operational lifetime). An SSR has a sensor which responds to an appropriate input (i.e., a control signal), a solid-state electronic switching device, which switches power to the load circuitry, and a coupling mechanism to enable the control signal to activate this switch without mechanical parts. The relay may be designed to switch either AC or DC loads. For NC SSRs, semiconductor switching parts with NC characteristics, such as depletion mode field effect transistors (FETs) or junction field effect transistors (JFETs) can be used. As these devices typically have high resistance in a conducting state, they are not suitable for high current switching.

One application for an SSR is in the context of controlling door locks. In situations where a closed circuit means that the door is locked, it may be preferred to use an NC switch, since this will result in the door remaining locked in the event of a power loss of the door lock controller. Door locks typically have power supplies supported by a backup battery, which only shuts down in the event of a fire, thereby allowing the doors to unlock. In contrast, the power supplies of the door lock controllers generally lack backup power supplies and might therefore change states when they lose power.

A problem with semiconductor switches is that most of them remain in an open, non-conducting state when they are not driven. Expressed differently, they exhibit NO characteristics, rather than the desirable NC characteristics. As a result, when there is a power failure on the control side of the SSR, these semiconductor switches default to an open state, regardless of their state prior to the power loss. In the context of a door lock, this is problematic, as it would be desirable for the state of the door lock not to change when there is a power disruption of the door lock controller.

This is difficult to achieve with semiconductor switches and traditional topology. Even though some NC silicon switching components exist, they are typically rated at tens or hundreds of milliamps, whereas electric door locks may require an output of 1-2 A. Thus, there is a need for a better NC relay, suitable both for general purposes, and in particular in the context of electric door locks.

SUMMARY

According to a first aspect, the disclosure relates to a solid-state relay, which includes:
- a semiconductor switch (106) having a control input (124) operable to cause the semiconductor switch (106) to shift from an open, non-conducting, position to a closed, conducting, position, in response to applying a voltage to the control input (124), wherein the closed position is associated with a parasitic resistance of the semiconductor switch (106); and
- a voltage boost block including a boost converter (104) and a ground connector (114), characterized in:
- a voltage output of the semiconductor switch (122) being electrically connected to a voltage input (108) of the boost converter (104), and a voltage output (110) of the boost converter (104) being electrically connected to the control input (124), wherein the ground connector (114) of the boost converter (104) is electrically connected to a voltage input of the semiconductor switch (106),
- parameters of the semiconductor switch (106) and the boost converter (104), including one or more of: the parasitic resistance, a threshold voltage at the control input of the semiconductor switch (106) and a voltage step-up ratio of the boost converter (104), are selected such that when the semiconductor switch (106) is in the closed position, a voltage at the voltage output (122) of the semiconductor switch (106) results in a voltage at the voltage output (110) of the boost converter (104) sufficient for application to the control input (124) at the semiconductor switch (106), to cause the semiconductor switch (106) to be maintained in a closed position in the absence of another control signal.

This combination of features makes it possible to create a NC SSR by combining existing components, such as enhancement mode FETs or Bipolar Junction Transistors (BJTs), in a novel and inventive configuration as power switching devices. Current flowing through a semiconductor switch creates voltage drop across the semiconductor switch due to the ohmic resistance of the switch. The boost voltage converter transforms the voltage at the output of the semiconductor switch, which is typically tens or hundreds of millivolts, to a voltage level that is sufficient to drive the semiconductor switch into a conducting state. By controlling/disabling the boost converter, the semiconductor switch can be turned off to non-conducting state. The SSR exhibits low resistance and voltage drop, thus allowing switching of heavy loads with very low power losses. By selecting suitable power switching devices, both the voltage and the current rating of the SSR can be set to a desired level within a wide range, making the SSR both an energy efficient and a cost efficient solution. As will be described in further detail below, while the embodiments described herein are intended for DC load switching, there are also alternative embodiments that are suitable for AC load switching. For example, this can be achieved by using two semiconductor switches (MOSFETs) connected back-to-back, forming a bidirectional switch. Further, no minimum switched current is needed for the SSR to stay in a conducting, low voltage drop state.

According to one embodiment, when the semiconductor switch is in the closed position, the voltage at the voltage output of the semiconductor switch is approximately in the range of 10-200 mV and the voltage at the control input of the semiconductor switch is approximately in the range of 2-5V. Typically these voltages are sufficient to drive the boost converter and the semiconductor switch, respectively.

According to one embodiment, the semiconductor switch is an enhancement mode Metal Oxide Semiconductor Field Effect Transistor (MOSFET) switch. MOSFET switches are well familiar to those having ordinary skill in the art and are standard components that are easy to obtain and integrate into any application that uses a semiconductor switch.

According to one embodiment, the boost converter is an Armstrong oscillator with a Junction Field Effect Transistor (JFET) and a voltage rectifier. The voltage rectifier can be, for example, a Greinacher voltage doubler. The boost converter provides a variable output voltage that is roughly proportional to the input voltage. The step-up ratio of the boost converter is approximately in the range of 1:10-1:200. Similar to MOSFET switches, an Armstrong oscillator is also a well familiar circuit to those having ordinary skill in the art, and the JFET is a standard component that is easy to obtain and integrate into any application that uses a semiconductor switch.

According to one embodiment, the boost converter further includes a control input operable to cause the boost converter to be disabled in the presence of a control signal and to be enabled in the absence of a control signal. Enabling the boost converter in the absence of a control signal produces the desired NC characteristic, that is, the SSR is in a conducting state without requiring a control signal.

According to a second aspect, the disclosure relates to a door lock control system comprising a solid-state relay as recited claim 1. The system further includes:
a control side, accessible to user input, and
a door lock side, operably connected to a lock;
wherein:
the solid-state relay (100) is arranged between the control side and the door lock side to operatively connect the control side with the door lock side,
the control side is operable to transmit a control signal to the boost converter (104), resulting in the semiconductor switch (106) engaging in the open position,
the door-lock side comprises an electrical actuator for controlling a door lock (304) and a power source (118), wherein the power source (118) has a supply voltage that is connected to a voltage input of the solid-state relay (100) and to the electrical actuator, and wherein a voltage output of solid-state relay (100) is connected to the electrical actuator so that the solid-state relay (100) and electrical actuator are connected in series,
such that when the semiconductor switch (106) is in the open position, no current flows through the electrical actuator and the supply voltage is present between voltage input and voltage output of the solid-state relay (100), and between a voltage input (108) and a ground connector (114) of an inactive boost converter (104), and when the semiconductor switch (106) is in the closed position, the current flowing through the electrical actuator and semiconductor switch (106) causes a voltage drop on the parasitic resistance of the semiconductor switch (106) such that the voltage reaching the boost converter input (108) is sufficiently increased by the boost converter (104) to result in a voltage at the control input (124) of the semiconductor switch (106) sufficient to cause the semiconductor switch (106) to be maintained in the closed position.

With this setup, it is possible to maintain the SSR in a closed position, even in the event of a power loss to the control side of the SSR. Ultimately, this results in a more secure and reliable door lock mechanism that uses conventional NO components, but in a different configuration compared to what is typically done in conventional powered door lock systems, and which exhibits NC characteristics. This configuration prevents a burglar or attacker from unlocking the door by simply destroying the power supply of the door controller, or by cutting the cable that delivers power to the door lock controller, thus creating a secure and reliable door lock mechanism.

According to one embodiment, the power supply is a DC power supply of 12-24V. This is a common way of providing power to most conventional powered door locks, so no particular adaptation is necessary on the power supply side to accommodate the door lock control system in accordance with the various embodiments of the disclosure.

The details of one or more embodiments of the disclosure are set forth in the accompanying drawings and the description below. Other features and advantages of the disclosure will be apparent from the description and drawings, and from the claims.

BRIEF DESCRIPTION OF THE DRAWINGS

Like reference symbols in the various drawings indicate like elements.

DETAILED DESCRIPTION

As was described above, a goal with the various embodiments of the disclosure is to achieve an SSR, which needs no driving energy to stay in a conducting state, and therefore is suitable for a number of applications, such as powered door locks. This is achieved, at least in part, by combining normally open (NO) semiconductor switching devices such as BJTs or enhancement mode FETs with a boost voltage converter, in an inventive and unconventional configuration to form a normally closed (NC) semiconductor switch.

More specifically, the various embodiments of the disclosure use the voltage drop across a conducting semiconductor switch as a power source to keep driving the semiconductor switch into the conducting state. The semiconductor switch is powered from switched circuit (e.g., a door lock circuit) which is often backed up by batteries. The voltage drop across the semiconductor switch (e.g., 100 mV) is boosted by a boost converter to a sufficient voltage (e.g., 5V) for driving gates of power MOSFETs used as semiconductor switching parts. Various embodiments of the disclosure will now be described in further detail and by way of example with reference to the drawings.

Figure 1:
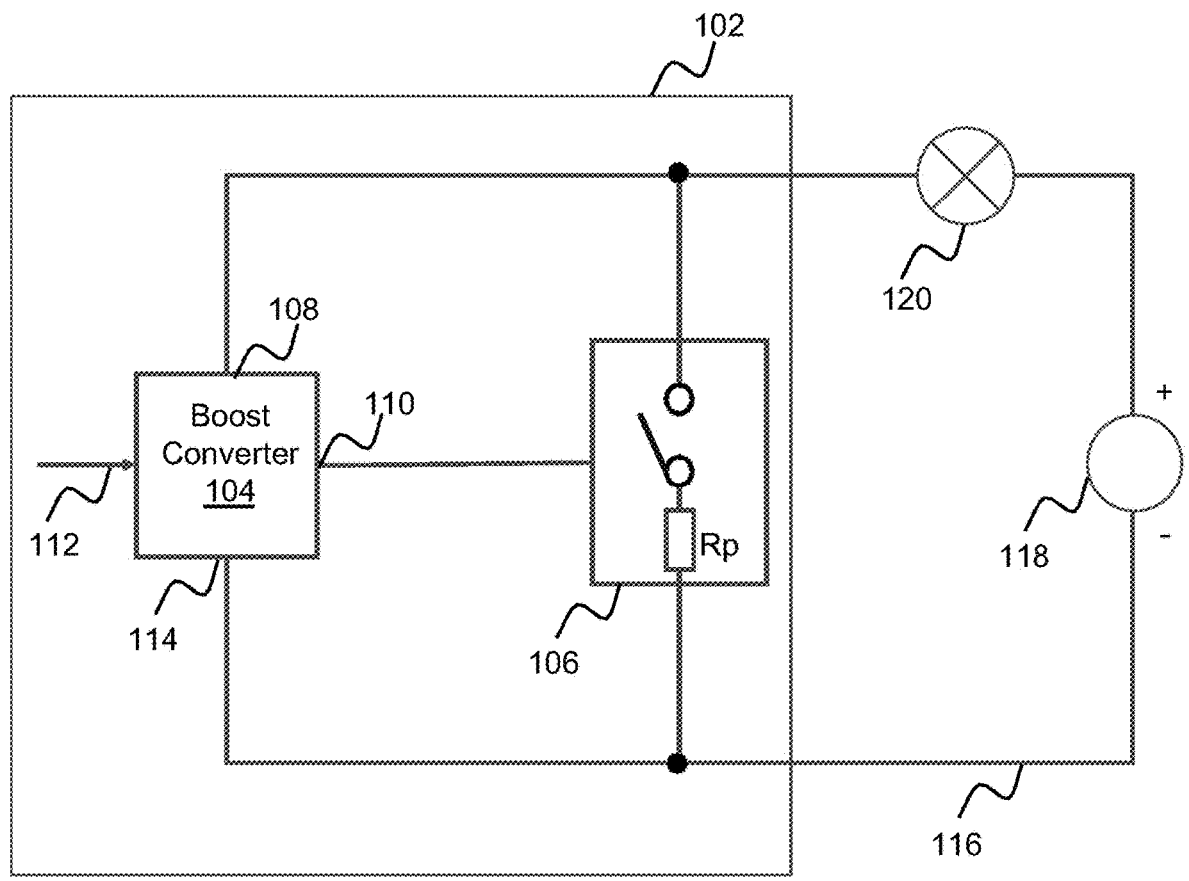
FIG. 1 is a schematic diagram of a solid state relay with a NO switch in an open position, in accordance with one embodiment.

FIG. 1 is a schematic circuit diagram showing an exemplary solid state relay (SSR) 100, in accordance with one embodiment. The SSR 100 has a control side, which contains the components inside the box formed by the dashed line 102, and a load side, which contains the components outside the box formed by the dashed line 102.

In the illustrated embodiment, the control side includes a boost converter 104 and a switch 106. As is well known to those having ordinary skill in the art, the boost converter 104 is configured to step up voltage from its input 108 to its output 110. Since power must be conserved, the current at the output 110 is lower than that at the input 108. FIG. 1 shows a configuration in which a control signal (i.e., voltage and current) is applied to a galvanically isolated control signal input 112 of the boost converter 104, thereby disabling the boost converter 104. The galvanic isolation can be accomplished by means of an optocoupler or transformer, for example. As a result, there is no current flowing through the output 110 of the boost converter 104 or the switch 106, and the SSR 100 is in a non-conducting state. Moreover, in a disabled state, the boost converter 104 has no current consumption, because any current consumption of the boost converter 104 would manifest itself like an SSR 100 that is not perfectly open when the switch 106 is in the open state. There are many different types of boost converters 104 that can be used in different embodiments. One example is an Armstrong oscillator with a Junction-gate Field Effect Transistor (JFET) and a Greinacher voltage doubler as rectifier. In the illustrated embodiment, the switch 106 is a NO semiconductor switch, for example, an N-channel MOSFET.

The load side of the SSR 100 includes a power source 118 and a load 120. Typically, the power source 118 is a DC source, but as will be described below, there are also embodiments in which the power source 118 is an AC source. The load 120 can be a variety of different loads. For purposes of this example, the load 120 illustrated in FIG. 1 is a powered door lock. When the boost converter 104 is not activated, no current flows at the output 110 of the boost converter 104. As a result, the switch 106 is in its open state, and no current flows in the outer circuit 116.

Figure 2:
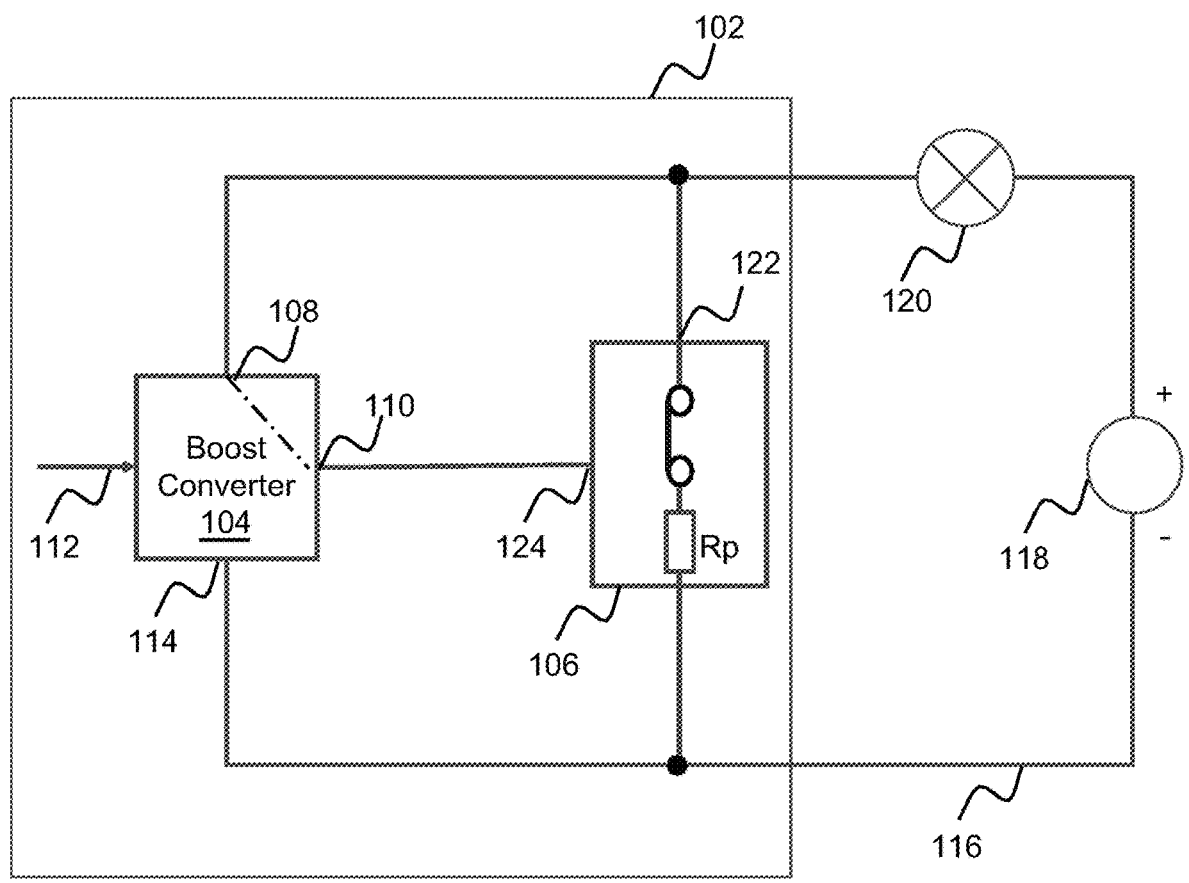
FIG. 2 is a schematic diagram of the solid state relay of FIG. 1, showing the NO switch in a closed position, in accordance with one embodiment.

FIG. 2 shows the SSR 100 of FIG. 1, when the boost converter 104 is activated by turning off the control signal at the control signal input 112, in accordance with one embodiment. As can be seen in FIG. 2, when the NO switch 106 is closed, a voltage drop (indicated by Rp in FIG. 2) occurs across the switch 106 due to its ohmic resistance, such that the voltage at the output 122 of the switch is approximately 100 mV, with a current of approximately 2A. This same voltage will be present at the input 108 of the boost converter 104. The boost converter 104 steps up (indicated by a dot-dash-line) this voltage to a voltage at its output 110, which is connected to the input 124 of the switch 106, that is sufficient to keep the NO switch 106 in a closed state. Thus, for all practical purposes, the switch 106 behaves as a NC switch that is powered by the power source 118 on the load side, which generally has some kind of backup (e.g., a battery or similar). Although the switch 106 uses the power source 118 to be driven into conducting state, it does not require a direct connection to the positive terminal of the power supply 118. Instead it uses the voltage drop across the switch 106 as a power source.

In the illustrated embodiment, the boost converter 104, is a non-stabilized type boost converter having an output voltage 110 that is roughly proportional to its input voltage 108. For example, with boost ratio of 50, the boost converter 104 converts 100 mV at the input 108 into 5V at the output 110. If, for any reason, the voltage at the output 122 of the semiconductor switch 106 were to decrease, the voltage at the input 108 of the boost converter 104 would also decrease. This would lead to a lower output voltage 110 from the boost converter 104, making the semiconductor switch 106 less conductive and the voltage at the output 122 of the semiconductor switch 106 would increase again. This kind of self-regulating feedback loop ensures that the voltage at the input 124 of the semiconductor switch 106 is right at the threshold level of the semiconductor switch 106.

Thus, the boost converter 104 does not deliver a fixed voltage (5V for example) to the input 124 of the semiconductor switch 106. Rather, the boost converter 104 provides a voltage that is sufficient for the switch 106 to start conducting. For typical MOSFETs, that voltage is typically in the range of 2V to 5V.

As a result, the power source on the load side maintains the closed state of the semiconductor switch 106, due to the boost converter 104 amplifying the voltage drop across the semiconductor switch 106. That is, when the control signal disappears from the control signal input 112 of the boost converter 104, the switch 106 will engage in its closed, conducting state, and the state of the load (e.g., door lock) will not change, until a new control signal is received at the control signal input 112, disabling the boost converter 104.

Figure 3:
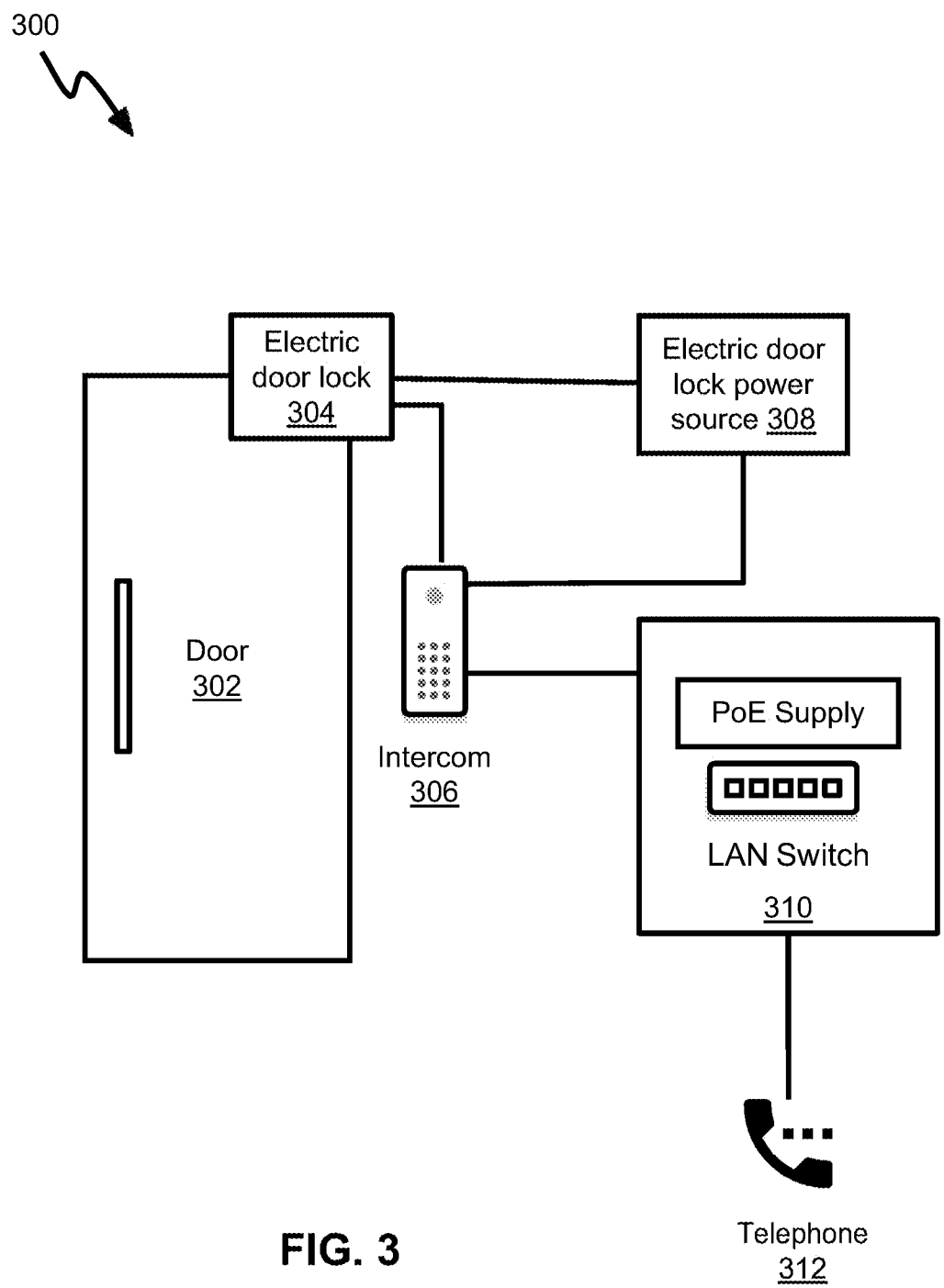
FIG. 3 is a door lock system that includes a solid state relay, in accordance with one embodiment.

FIG. 3 shows an exemplary environment 300 in which various embodiments of the disclosure can be implemented. As can be seen in FIG. 3, a door 302 to a building is controlled by a powered electric door lock 304. The electric door lock 304 corresponds to the load 120 illustrated in FIGS. 1 and 2. The electric door lock 304 is powered by an electric door lock power source 308, such as the power source 118 illustrated in FIGS. 1 and 2. An intercom 306 is located next to the door 302 and is powered by a LAN switch 310 with Power over Ethernet (PoE) functionality. The intercom 306 includes the control side components 102 of the SSR 100, and communicates with a telephone 312 through the Local Area Network (LAN) switch 310.

All components, except for the door 302 itself and the intercom are located inside the building. When users want to enter the door 302 to the building, they interact with the intercom 306 to authenticate themselves to a person or computer at the telephone 312, and upon successful authentication, the person or computer at the telephone 312 unlocks the door 302 such that the users can enter. It should be noted that while a telephone 312 is illustrated in FIG. 3 for simplicity, the telephone 312 is intended to symbolize any type of manned or unmanned response equipment, which has the ability to verify user credentials and authorize a user to enter through the door 302. For example, in some embodiments, the telephone 312 can be a unit with a screen, that can display an image captured by a camera by the intercom 306, such that a guard manning the telephone 312 can visually identify the person trying to enter the door 302. It can be a cellular phone or computer, a dedicated response unit, etc. In other embodiments, the telephone 312 can represent a completely automated unit that recognizes information stored on a card that is swiped at the intercom 306, or that recognizes biometric user data collected at the intercom 306, for example. Many authentication levels can be implemented depending on the particular situation at hand, which are familiar to those having ordinary skill in the art.

It should be noted that while specific voltages have been discussed above, these may vary depending on the specific components that are used. For example, the power source 118 can generally be in the range of 12-24V, which is the typical range for door locks. However, the SSR can be used in a much wider voltage range too, such as approximately 1-1000V. The input voltage to the boost converter 104 can generally be in the range of 10-200 mV. The voltage at the control input 124 of the semiconductor switch can go as low as 1V, although currently 2-5V is a commonly used input voltage range for MOSFETs. Of course, these ranges will change as alternative components become available, but the general principles of the disclosure will remain the same.

It should be noted that even though the SSR relay 100 has been described above with respect to an enhanced mode MOSFET, the same general principles also work with Insulated-Gate Bipolar Transistor (IGBT) or BJT parts. Using Bipolar Junction Transistors (BJTs) would require much higher power to be delivered to their control input 124 to drive them into their conducting state. Thus, in such an embodiment the boost converter 104 is a more complex circuit compared to one used in an embodiment using an SSR with a MOSFET. Since IGBTs, similar to MOSFETs, have low driving power demands, they may be a good alternative for high voltage and high current applications. Compared to IGBTs, MOSFETs typically exhibit a lower voltage drop and lower power losses in a closed state, thus being a preferred component for the semiconductor switch 106.

Further, while the SSR relay 100 has been described above in the context of a DC power source, the various embodiments of the disclosure can also be extended to situations in which the power source is an AC power source. In one embodiment, such a setup can be achieved, for example, by connecting two MOSFETs back-to-back as an AC power switch. Since the boost converter 104 can only work with the proper polarity of voltage at its input 108, the boost converter 104 will only be producing output voltage during positive half-periods of supply voltage, while it will not run during negative half-periods. Adding some capacitance at the output 110 of the boost converter 104, creates an energy storage that can supply the gates of the MOSFETs during the negative half-periods. The specific details when it comes to choosing specific components for such implementations lie well within the expertise of those having ordinary skill in the art.

The flowcharts and/or block diagrams in the figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be appreciated that a person skilled in the art can modify the above-described embodiments in many ways and still use the advantages of the disclosure as shown in the embodiments above. Thus, the disclosure should not be limited to the described embodiments but should only be defined by the appended claims. Additionally, as the skilled person understands, the shown embodiments may be combined.

What is claimed is:

1. A door lock control system comprising:
   a solid-state relay comprising:
      a semiconductor switch having a control input operable to cause the semiconductor switch to shift from an open, non-conducting, position to a closed, conducting, position, in response to applying a voltage to the control input, wherein the closed position is associated with a parasitic resistance of the semiconductor switch; and
      a voltage boost block including a boost converter and a ground connector,
      wherein a voltage output of the semiconductor switch is electrically connected to a voltage input of the boost converter, and a voltage output of the boost converter is electrically connected to the control input, wherein the ground connector of the boost converter is electrically connected to a voltage input of the semiconductor switch,
      wherein parameters of the semiconductor switch and the boost converter, including one or more of: the parasitic resistance, a threshold voltage at the control input of the semiconductor switch, and a voltage step-up ratio of the boost converter, are selected such that, when the semiconductor switch is in the closed position, a voltage at the voltage output of the semiconductor switch results in a voltage at the voltage output of the boost converter sufficient for application to the control input at the semiconductor switch, to cause the semiconductor switch to be maintained in a closed position in the absence of another control signal;
   a control side, accessible to user input, and
   a door lock side, operably connected to a lock;
   wherein:
      the solid-state relay is arranged between the control side and the door lock side to operatively connect the control side with the door lock side, and
      the control side is operable to transmit a control signal to the boost converter, resulting in the semiconductor switch engaging in the open position,
      the door-lock side comprises an electrical actuator for controlling a door lock and a power source, wherein the power source has a supply voltage that is connected to a voltage input of the solid-state relay and to the electrical actuator, and wherein a voltage output of solid-state relay is connected to the electrical actuator so that the solid-state relay and electrical actuator are connected in series,
      such that when the semiconductor switch is in the open position, no current flows through the electrical actuator and the supply voltage is present between voltage input and voltage output of the solid-state relay, and between a voltage input and a ground connector of an inactive boost converter, and when the semiconductor switch is in the closed position, the current flowing through the electrical actuator and semiconductor switch causes a voltage drop on the parasitic resistance of the semiconductor switch such that the voltage reaching the boost converter input is sufficiently increased by the boost converter to result in a voltage at the control input of the semiconductor switch sufficient to cause the semiconductor switch to be maintained in the closed position.

2. The door lock control system of claim 1, wherein:
when the semiconductor switch is in the closed position, the voltage at the voltage output of the semiconductor switch is in the range of 10-200 mV and the voltage at the control input of the semiconductor switch is in the range of 2-5 V.

3. The door lock control system of claim 1, wherein the semiconductor switch is an enhancement mode Metal Oxide Semiconductor Field Effect Transistor (MOSFET) switch.

4. The door lock control system of claim 1, wherein the boost converter is an Armstrong oscillator with a Junction Field Effect Transistor (JFET) and a voltage rectifier.

5. The door lock control system of claim 1, wherein the boost converter further includes a control input operable to cause the boost converter to be disabled in the presence of a control signal and to be enabled in the absence of a control signal.

6. The door lock control system of claim 1, wherein the power supply is a Direct Current (DC) power supply in the range of 12-24 V.

\* \* \* \* \*